United States Patent
Weiss et al.

(10) Patent No.: US 7,439,737 B2
(45) Date of Patent: Oct. 21, 2008

(54) CONTRAST PREPARED MRI INVOLVING NON-CARTESIAN TRAJECTORIES WITH OVERSAMPLING OF THE CENTER OF K-SPACE

(75) Inventors: Steffen Weiss, Hamburg (DE); Tobias Schaeffter, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 37 days.

(21) Appl. No.: 11/569,071

(22) PCT Filed: May 3, 2005

(86) PCT No.: PCT/IB2005/051449

§ 371 (c)(1),
(2), (4) Date: Nov. 14, 2006

(87) PCT Pub. No.: WO2005/111647

PCT Pub. Date: Nov. 24, 2005

(65) Prior Publication Data

US 2008/0012563 A1    Jan. 17, 2008

Related U.S. Application Data

(60) Provisional application No. 60/570,973, filed on May 14, 2004.

(51) Int. Cl.
*G01V 3/00* (2006.01)
(52) U.S. Cl. .................................. 324/307; 324/309

(58) Field of Classification Search ................ 324/306, 324/307, 309; 600/420
See application file for complete search history.

(56) References Cited

U.S. PATENT DOCUMENTS

| 6,195,579 | B1* | 2/2001 | Carroll et al. ............... 600/420 |
| 6,487,435 | B2* | 11/2002 | Mistretta et al. ............ 600/420 |
| 6,630,828 | B1 | 10/2003 | Mistretta et al. |
| 7,309,984 | B2* | 12/2007 | Arunachalam et al. ...... 324/307 |
| 2001/0027262 | A1 | 10/2001 | Mistretta et al. |
| 2001/0033162 | A1 | 10/2001 | Harvey et al. |
| 2004/0064033 | A1 | 4/2004 | Dale et al. |

OTHER PUBLICATIONS

Altbach, M.I., et al.; Radial MRI Techniques for Obtaining Motion-Insensitive High-Resolution Images with Variable Contrast; 2002; IEEE; pp. 125-128.

(Continued)

*Primary Examiner*—Louis M Arana

(57) ABSTRACT

A method of magnetic resonance imaging is provided. The method includes the steps of applying a preparation pulse sequence to a subject (16) disposed in an examination region (14), acquiring k-space data related to a plurality of k-space trajectories through the center of k-space such as radial trajectories and reconstructing a first image form the k-space data wherein data within a region (210) around the center of k-space (205) of at least a first of the k-space trajectories is not used. Rather, data of only a limited number of views within said region is used for image reconstruction. Hence, image contrast is essentially determined by said limited number of views.

10 Claims, 4 Drawing Sheets

OTHER PUBLICATIONS

Altbach, M.I., et al.; Radial Fast Spin-Echo Method for T2-Weighted Imaging and T2 Mapping of the Liver; 2002; J. of Magnetic Resonance Imaging; 16:179-189.

Peters, D. C., et al.; Improved Fat Suppression for Coronary MR Angiography with Radial Balanced 3D SSFP through Interleaved Weighted Projection Sets; 2004; Proc. Intl. Soc. Mag. Reson. Med.; 11; p. 1896.

Song, H.K., et al.; Dynamic MRI with Projection Reconstruction and KWIC Processing for Simultaneous High Spatial and Temporal Resolution; 2004; MRM; 52:815-824.

Song, H.K., et al.; k-Space Weighted Image Contrast (KWIC) for Contrast Manipulation in Projection Reconstruction MRI; 2000; MRM; 44:825-832.

\* cited by examiner

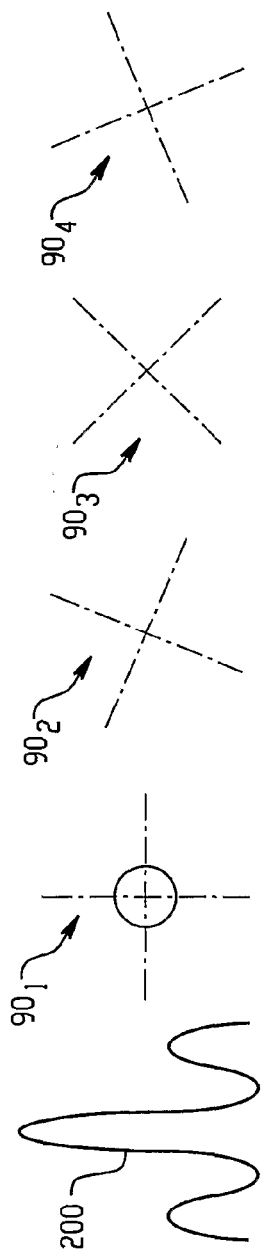
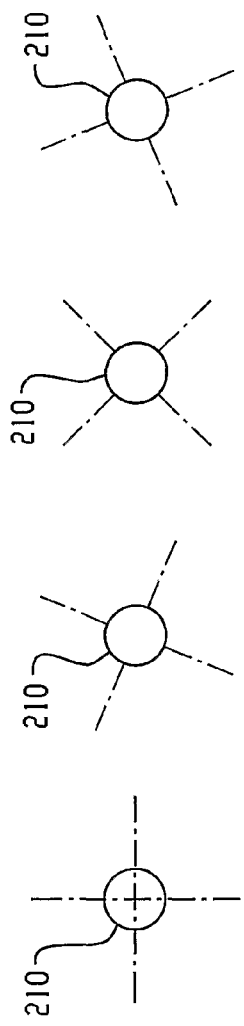
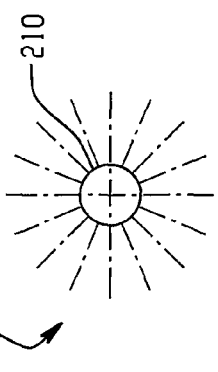
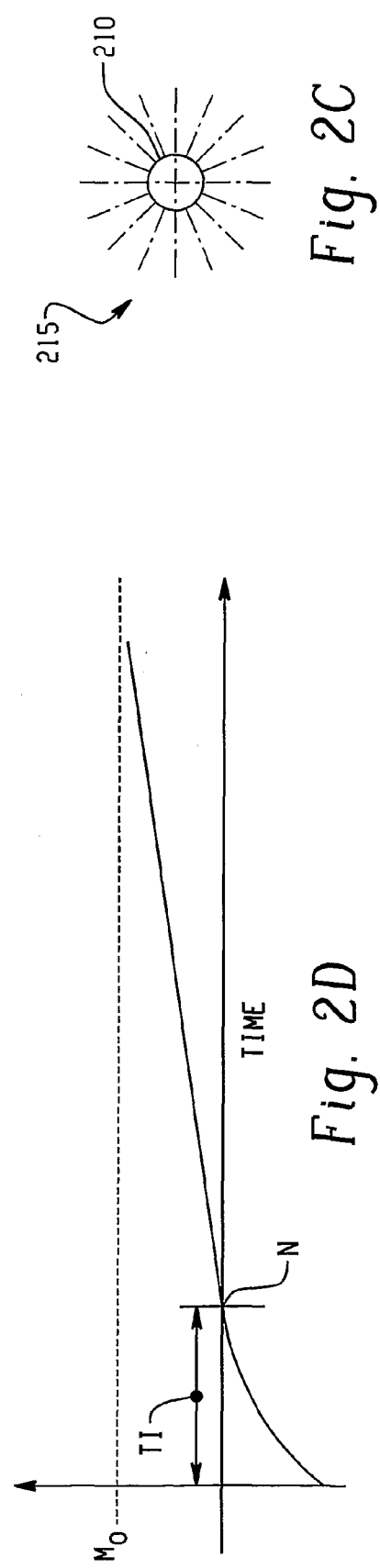
Fig. 2A
Fig. 2B
Fig. 2C
Fig. 2D

CONTRAST PREPARED MRI INVOLVING NON-CARTESIAN TRAJECTORIES WITH OVERSAMPLING OF THE CENTER OF K-SPACE

CROSS REFERENCE TO RELATED APPLICATIONS

This application claims the benefit of U.S. Provisional Application Ser. No. 60/570,973 filed May 14, 2004, which is incorporated herein by reference.

DESCRIPTION

The following relates to the magnetic resonance arts. It finds particular application in magnetic resonance imaging employing magnetization preparation techniques and non-Cartesian sampling of k-space and will be described with particular reference thereto.

In general, imaging techniques in MRI take advantage of contrast between tissues to identify the location of structures of interest. One aspect of MR imaging is the ability to manipulate contrast in various ways using magnetization preparation schemes. Common examples of preparation schemes include inversion recovery sequences, magnetization transfer contrast sequences, sequences for cardiovascular imaging such as white and black blood techniques and those with T2 preparation, tissue (e.g. fat) saturation techniques such as chemical selective saturation, short inversion recovery (STIR) and spectral presaturation with inversion recovery (SPIR), and regional saturation techniques.

With respect to imaging applications, many cardiovascular imaging sequences implement preparation pulses. The preparation sequences can be especially important in coronary artery imaging. The reason for this is that the coronary arteries are embedded in fatty tissue. Therefore, delineation between the arteries and fat can be facilitated by suppression of signals from the fat.

Coronary MRA techniques including various contrast preparations have been demonstrated for Cartesian k-space sampling. As part of the sampling, centric view ordering is applied for such sequences. Here, the central part of k-space is acquired in connection with the period of high contrast to take advantage of the fact that most of the contrast encoding is determined by the center of k-space, whereas outer k-space determines spatial resolution and contributes less to image contrast.

Another application where preparation pulses have been used is in T1 quantification. These techniques are based on measuring the longitudinal magnetization at different time intervals after an inversion or saturation pulse. Clinically, T1 imaging can be applied for the determination of contrast agent concentration for cardiac studies, oncological breast exams, and oncological brain exams. Another application is T1 relaxometry of multiple sclerosis, a disease which reduces T1 in a way which can require a quantitative determination of T1 to facilitate diagnosis.

Many of the above applications utilize Cartesian trajectories to scan k-space during image acquisition. Cartesian trajectories are susceptible to motion artifacts, however. Imaging using radial trajectories through k-space, on the other hand has several advantages over Cartesian trajectories. These advantages include: its robustness with respect to motion; the possibility to reduce measurement time by undersampling in k-space without introducing ghost-like artifacts; and the possibility to reconstruct a fully resolved image as well as a time series of lowly resolved images from the same data. These properties are a consequence of the intrinsic oversampling of the center of k-space.

However, the intrinsic oversampling also has a disadvantageous consequence. Radial imaging can not make use of magnetization preparation to achieve special image contrasts, as it is common for Cartesian imaging. The reason for this is that for most magnetization preparation schemes, the effect of the preparation is maximal for a certain point in time after the preparation. The effect and fades with relaxation, or time. As discussed above, to facilitate the effect of the preparation on the contrast in the image Cartesian scan acquisition orders can be chosen that measure the central k-space at the time when the preparation is maximal. For radial imaging, the intrinsic oversampling, i.e., the repeated acquisition around the center of k-space through time makes these preparation schemes less effective.

The present invention contemplates an improved apparatus and method that overcomes the aforementioned limitations and others.

In accordance with one aspect of an embodiment of the invention, a method of magnetic resonance imaging is provided. The method includes the steps of applying a preparation pulse sequence to a subject disposed in an examination region, acquiring k-space data related to a plurality of k-space trajectories through the center of k-space, and reconstructing a first image from the k-space data wherein data within a region around the center of k-space of at least a first of the k-space trajectories is not used.

One advantage resides in using non-cartesian trajectories through k-space with contrast prepared preparation sequences.

Another advantage is that the reduction of motion artifacts is facilitated.

Another advantage is that image contrast is facilitated.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 1 diagrammatically shows a magnetic resonance imaging system.

FIG. 2A shows a preparation sequence and k-space sampling trajectories.

FIG. 2B shows k-space data used for image reconstruction.

FIG. 2C shows a composite view of the k-space data used for image reconstruction.

FIG. 2D shows a longitudinal magnetization curve for a tissue of interest.

Figure 1:
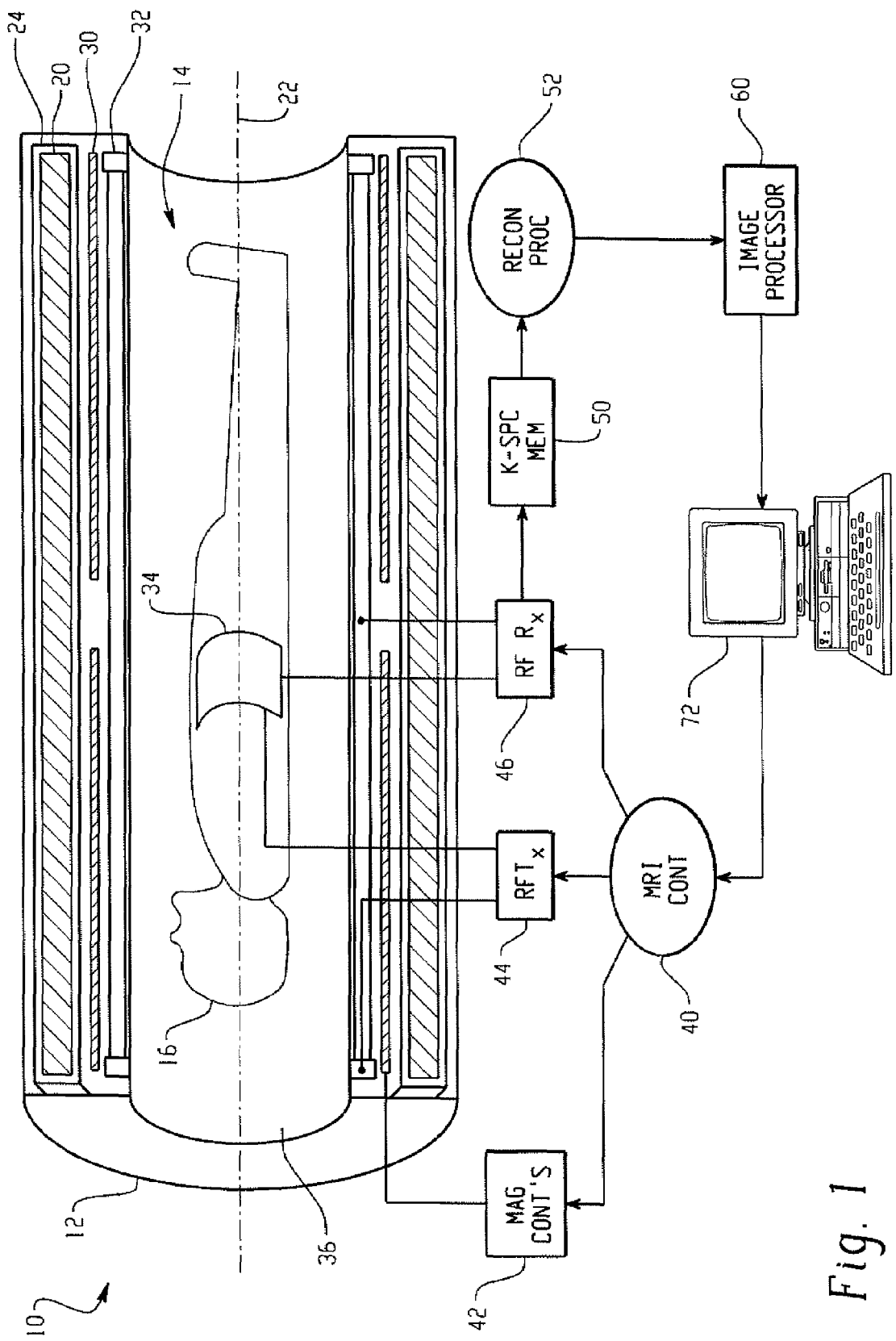

With reference to FIG. 1, an example of a magnetic resonance imaging scanner 10 is shown. In the embodiment shown, the MRI scanner includes a housing 12 defining a generally cylindrical scanner bore, or examination region, 14 inside of which an associated imaging subject 16 is disposed. Main magnetic field coils 20 are disposed inside the housing 12. The main magnetic field coils 20 are arranged in a generally solenoidal configuration to produce a main $B_o$ magnetic field directed along a central axis 22 of the scanner bore 14.

The housing 12 also houses or supports magnetic field gradient coils 30 for selectively producing magnetic field gradients parallel to the central axis 22 of the bore 14, along directions transverse to the central axis 22, and/or along other selected directions. The housing 12 may also house or support a radio frequency coil 32, such as a body coil, for selectively exciting and/or detecting magnetic resonances associated with the subject 16. A local radio frequency 34 may be disposed in the scanner bore 14 for locally selectively exciting and/or detecting magnetic resonance associated with the subject 16.

Continuing with the embodiment shown in FIG. 1, a magnetic resonance imaging controller 40 controls magnet controllers 42 to selectively energize the magnetic field gradient coils 30. The MRI controller 40 also controls a radio frequency transmitter 44 coupled to the body coil 32 and/or coupled to the local coil 34, to selectively energize those RF coils 32, 34. By selectively operating the magnetic field gradient coils 30 and the RF coils 32, 34 magnetic resonance is generated and spatially encoded in at least a portion of a selected region of interest of the imaging subject 16. In addition, preparation pulses can be applied to the subject.

By applying selected magnetic field gradients via the gradient coils 30, selected k-space trajectories can be traversed, such as Cartesian trajectories, radial trajectories, spiral trajectories, and the like. During traversal of the selected k-space trajectory, the magnetic resonance imaging controller 40 operates a radio frequency receiver 46 selectively coupled to the body coil 32 or local coil 34 to receive RF signals from the subject 16. The received RF signals are stored as acquired k-space samples in a k-space memory 50.

A reconstruction processor 52 processes and reconstructs the k-space data into reconstructed images which can then be stored in an image processor 60. The reconstructed images can be further processed in the image processor 60, and can be displayed on a user interface 72, stored in non-volatile memory, transmitted over a local intranet or the Internet, viewed, stored, manipulated, or so forth. The user interface 72 can also enable a radiologist, technician, or other operator of the magnetic resonance imaging scanner 10 to communicate with the magnetic resonance imaging controller 40 to select, modify, and execute magnetic resonance imaging sequences.

In operation, the main magnetic field coils 20 produce a main magnetic field in the bore 14. Via their respective controllers, the gradient coils 30 and selected RF coils 32, 34 carry out the imaging protocols shown in FIGS. 2A, 2B, and 3A.

FIG. 2A shows a protocol which includes applying a preparation sequence 200 to the subject 16 at time $t_0$. In one embodiment the preparation sequence is an inversion pulse which causes the spins of the subject that are aligned in the direction of the main magnetic field (+$B_0$) to flip 180 degrees (-$B_0$). A pre-selected time, or inversion time (TI) is then allowed to pass to allow the spins to recover towards +B0. Then, at time TI, following the preparation pulse, an imaging sequence is performed.

Continuing with the embodiment shown in FIG. 2A, radial sampling trajectories 90 through k-space are employed. As shown, the radial sampling trajectories 90 converge at or near the center of k-space. As such, the radial sampling trajectories 90 provide a higher sampling density near the center of k-space center than near the edges of k-space. This is due to the convergence of the radial sampling trajectories 90. While FIG. 2A shows planar radial sampling trajectories 90, it is also contemplated to employ radial sampling trajectories three-dimensionally. The sampled k-space data is stored in the k-space memory 50 as the data are acquired.

While FIG. 2A shows four subsets of radial k-space trajectories, it is to be understood that various numbers of subsets can be implemented. It is also to be understood that, while orthogonal pairs can be used, the orthogonal pairs are not required. The orthogonal pairs illustrates a subset of k-space trajectories, that themselves cover k-space evenly in an angular direction. A subset can also include more than two trajectories which form a star-like pattern such that the subset of projections is equally distributed over the angular range of k-space. The next subset can then be acquired with a small angular increment from the first subset so that these projections fitting between the previous acquired ones. This acquisition process continues until the subsets, when combined, evenly cover k-space.

Following data acquisition by the RF receive coil and storage in the k-space memory, the k-space data are passed to the reconstruction processor 52, an image or images can be reconstructed. FIG. 2B shows an embodiment of the k-space data used for such purpose. In the embodiment shown, for the first subset of trajectories $90_1$, data within a region 210 around the center of k-space 205 as well as data outside the region is used for image reconstruction. For the remaining pairs of trajectories $90_2$, $90_3$, $90_4$, only data from outside the region 210 is used for image reconstruction. The data within the region for these latter trajectories is not used for reconstructing the image. A composite view 215 of the k-space data used for reconstructing an image in accordance with this embodiment is shown in FIG. 2C.

In the above embodiment, the first subset of trajectories $90_1$ is established as that occurring nearest a null point N of a set of spins shown in FIG. 2D. As shown in FIG. 2D, the spins of, for example, fat tissue are inverted with the preparation pulse 200, or fat saturation pre-pulse. The null point N occurs where the longitudinal magnetization of the fat relaxes and reaches a value of zero. Because the fat tissue is nulled at time TI, relatively little signal from fat is acquired during the acquisition of the first subset of trajectories $90_1$. As the fat signal recovers, however, it contributes to the subsequent trajectories. Returning to FIGS. 2B and 2C, for the region around the center of k-space, only the first pair of trajectories contributes to the image. As a consequence, image contrast is dominated by the conditions during the acquisition of the first subset of trajectories and fat suppression is achieved.

With respect to the region around the center of k-space, it can be defined in a number of ways either iteratively or empirically. It can be chosen as a constant across every trajectory. The subsets serve well where the region is constant, in which case the subsets can binned and processed together. The region can also be determined as a function of the magnetization shown in FIG. 2D. For example, the region 210 around the center of k-space can be determined on a trajectory by trajectory basis according to equation 1 below:

$$R = \frac{|M(t)|}{M_0} k_{\max} \qquad (1)$$

where, in the case of the region being a circle or sphere, R is the diameter of the region 210, M(t) is the longitudinal magnetization of the tissue at any given time corresponding to a subset of trajectories, and $M_0$ is the longitudinal magnetization of the suppressed tissue in a relaxed condition as shown in FIG. 2D. Here each trajectory is processed using its own region 210 as calculated above. Accordingly, division of the data into subsets $90_1 \ldots 90_4$ is not required.

More generally, the region around the center of k-space can vary according to equation 2 below:

$$R = f\left(\frac{|M(t)|}{M_0}\right) \qquad (2)$$

where $f$ is a monotonous function having values ranging from 0 to kmax.

The region 210 can also be similarly determined as a function of time, where the further the trajectories are from the null point, the larger the region gets. Further, while the region can be a circle or sphere centered around the center of k-space, although other shapes and positions are contemplated.

The subsets serve well where the region is constant, in which case the subsets can binned and processed together.

Figure 4A:
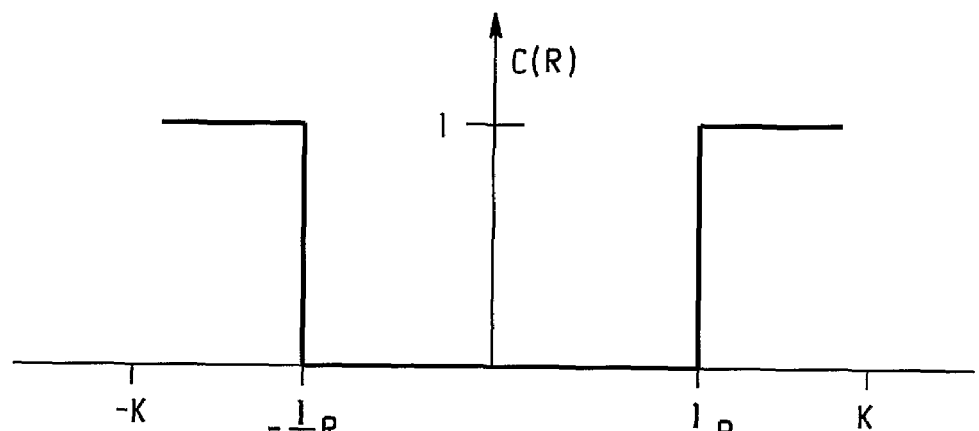
FIG. 4A shows a scaling function for scaling k-space trajectory data.

Once the region 210 has been established, the reconstruction processor 52 applies a scaling function to the trajectories. In one embodiment, the scaling function C(R) is a step function as shown in FIG. 4A. In this embodiment, the data within the region bounded by −½R and +½R are effectively eliminated and the data outside the region to the edges of k-space (−k, +k) are left to contribute to the image reconstruction.

Figure 4B:
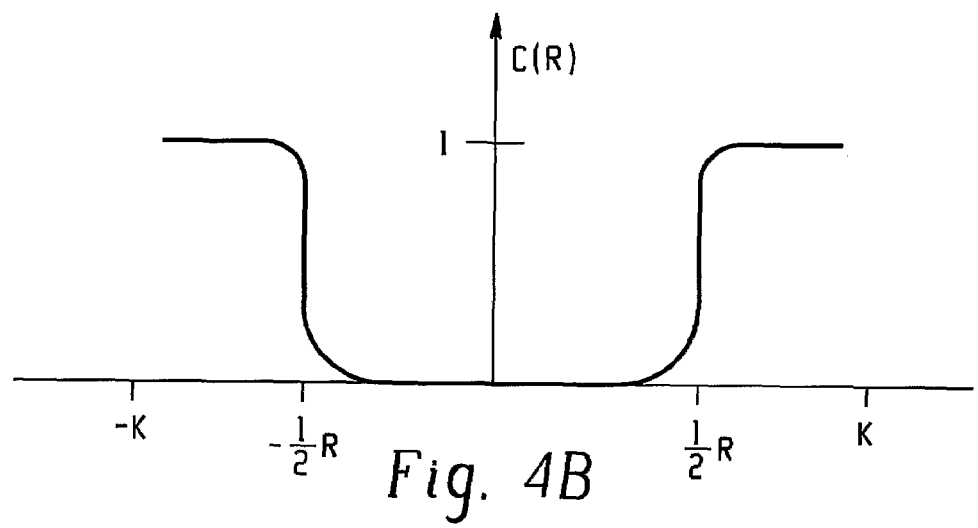
FIG. 4B shows an apodization scaling function for scaling k-space trajectory data.

In another embodiment, shown in FIG. 4B, the reconstruction processor 52 can apply a scaling function C(R) with an integrated apodization function. Such a function provides a smoother transition between the region 210 and the rest of k-space as compared to a step function. Here, the transitions can be defined, for example, by a sine function.

Figure 4C:
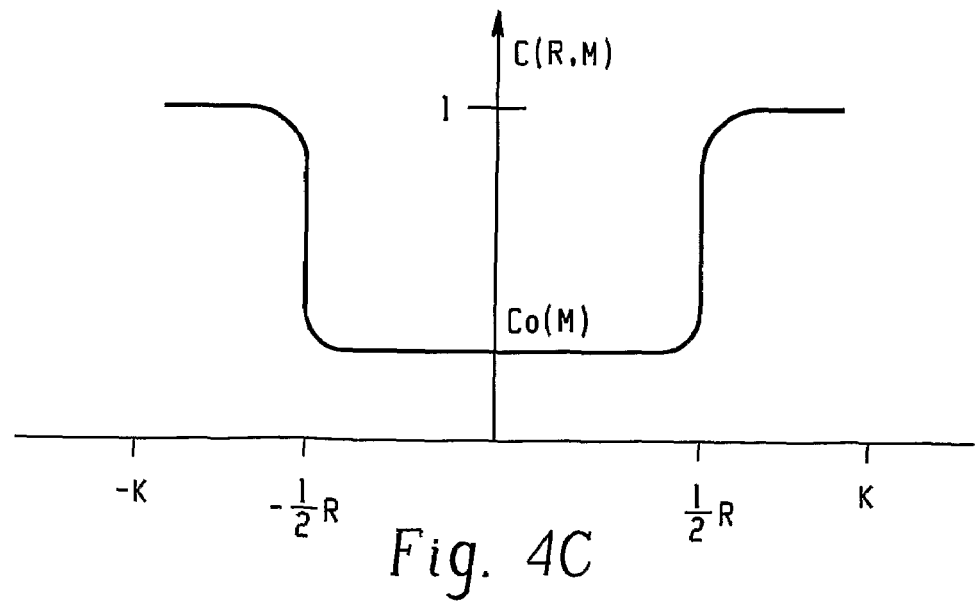
FIG. 4C shows a scaling function which is a function of a longitudinal magnetization of a tissue for scaling k-space trajectory data.

In yet another embodiment the scaling function can depend on the tissue magnetization M(t) as shown in FIG. 4C. In this embodiment, the values in region 210 are not simply scaled to 1 for subset $90_1$ and to 0 for subsets $90_2$, $90_3$, $90_4$. Here the data are scaled according to the scaling function C(R,M), where, within the region 210, the data are scaled according to equation 3 below:

$$C_0(M) = \frac{M_0 - |M(t)|}{M_0} \qquad (3)$$

More generally, the data can be scaled according to the scaling function C(R,M), where, within the region 210, the data are scaled according to equation 4 below:

$$C_0(M) = f\left(\frac{M_0 - |M(t)|}{M_0}\right) \qquad (4)$$

where $f$ is a monotonous function having values ranging from 0 to 1.

In another embodiment, once the region 210 has been established, the MR scanner can be controlled to omit the acquisition of k-space data within the region for the relevant trajectories. Or, as set forth above, fall data sets for each trajectory can be acquired and the data within the region 210 can be omitted completely or scaled down during image reconstruction.

While the trajectory or trajectories which include data within the region 210 around the center of k-space are collected in proximity to TI, the other trajectories do not have to be collected subsequent to TI. Thus, in another embodiment, trajectories can be collected before and/or after TI.

Figure 3A:
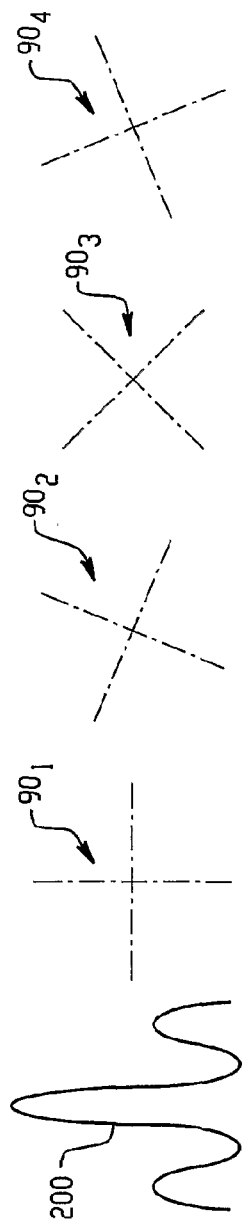
FIG. 3A shows a preparation sequence and k-space sampling trajectories.
Figure 3B:
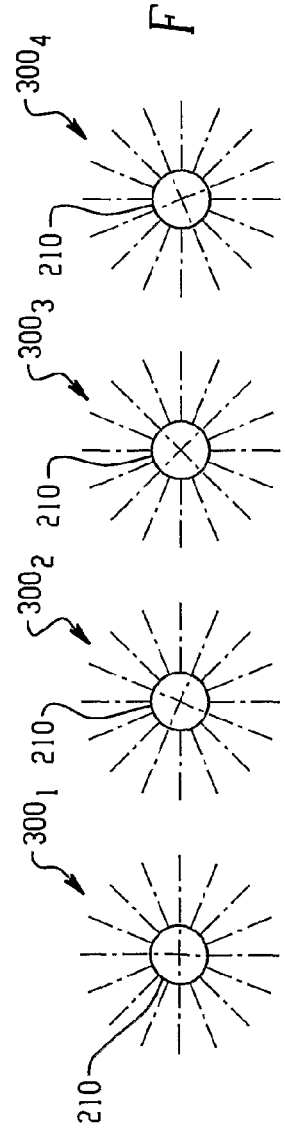
FIG. 3B shows composite views of k-space data used for reconstruction of a number of images.

In another embodiment shown in FIGS. 3A and 3B, more than one image can be reconstructed from the set of k-space data with each image having different trajectories contributing data to the center of k-space during image reconstruction. Here, as shown in FIG. 3A, following a preparation sequence or pulse, trajectories are collected as discussed above in connection with FIG. 2A.

In this embodiment the data stored in the k-space memory 50 are passed to the reconstruction processor 52. As shown in FIG. 3B, a number of images are formed from the data with each image being formed from a different set, $300_1$, $300_2$, $300_3$, $300_4$ of k-space data. For example a first image can be formed from the first data set $300_1$ in FIG. 3B. That data set includes data from within the region 210 around the center of k-space from the first set of trajectories $90_1$ and data from outside the region around the center of k-space from all of the trajectories $90_1 \ldots 90_4$. A second image can be formed from the second data set $300_2$ shown in FIG. 3B. That data set includes data from within the region 210 around the center of k-space from the second set of trajectories $90_2$ and data from outside the region around the center of k-space from all of the trajectories. In an analogous way, third and fourth images can be generated from the third and fourth data sets shown in FIG. 3B. Consequently, in the case where the preparation pulse 200 is an inversion pulse, each reconstructed image has a different effective inversion time.

It is to be understood that establishing the region 210 around the center of k-space and the scaling functions discussed above can be used in conjunction with the image processing of the data sets shown in FIGS. 3A and 3B.

The images generated from the data sets $300_1$, $300_2$, $300_3$, $300_4$ are then sent to an image processor 60 for further processing. From the series of images, the image processor can generate a time course of the signal for any given pixel or pixels. The image processor can then fit an exponential to the time course for each pixel. For the example of an inversion pre-pulse the T1 value is one fit parameter and a mapping of T1 values for any number of pixels can be generated and further processed.

Figure 3C:
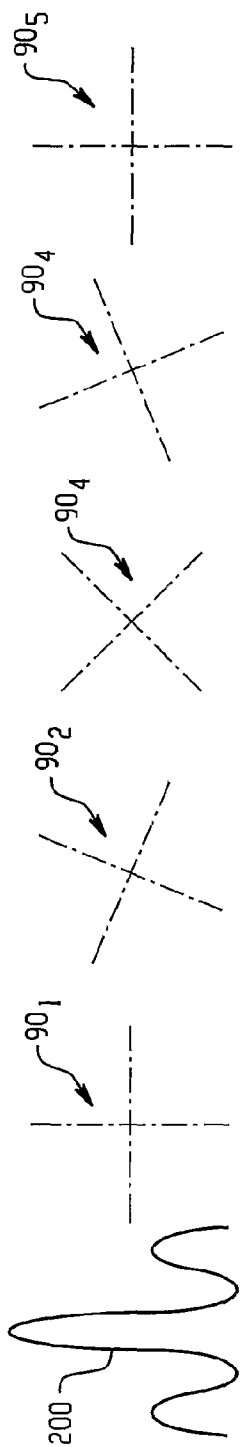
FIG. 3C shows a preparation sequence and k-space sampling trajectories used in a sliding window technique.

In addition, as shown in FIG. 3C, a sliding window reconstruction can be performed. Here, for example, further subsets, such as subset $90_5$, of k-space trajectories can be acquired. This further subset $90_5$ can have the same orientation as the first subset $90_1$. Then, a further series of data sets $300_{2'}$, $300_{3'}$, $300_{4'}$, $300_5$ can be generated from subsets $90_2 \ldots 90_5$ as shown in FIG. 3C. The difference between sets $300_2$ and $300_{2'}$ is that set $300_2$ includes data from the first subset of trajectories whereas set $300_{2'}$ includes data from the fifth subset of trajectories. The same holds true for the third and forth images.

Figure 3D:
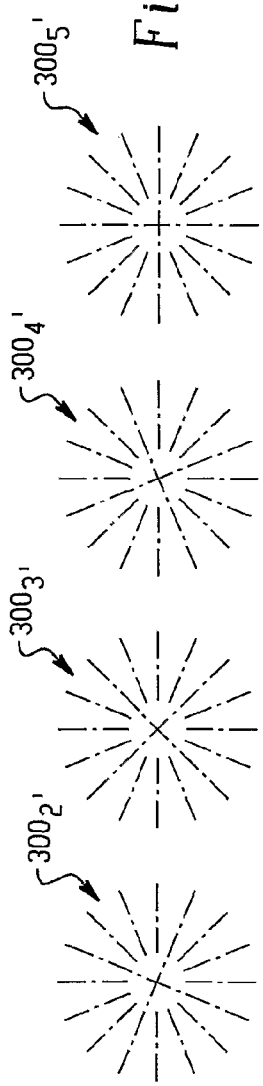
FIG. 3D shows composite views of k-space data used for reconstruction of a number of images used in a sliding window technique.

From the second series of images related to the data sets shown in FIG. 3D, the image processor can generate a time course of the signal for any given pixel or pixels. As with the first series of images, the image processor can then fit an exponential to the time course for each pixel. Again, for the example of an inversion pre-pulse the T1 value is one fit parameter and a mapping of T1 values for any number of pixels can be generated and further processed. The generation of a series of T1 maps using this sliding window technique results in a time course of the T1 value for each pixel, in other words, a time resolved T1 map.

In a case where, for example, a contrast agent is used in the imaging protocol, a T1 map without the contrast agent can be generated. Then, following the introduction of the contrast agent a time course of the T1 map can be generated. T1 value depends on the contrast agent concentration c according to equation 5 below:

$$\frac{1}{T_1} = R_1 = \alpha \cdot c + R_1^0 \quad (5)$$

where $\alpha$ is a property of the contrast agent and $R_1^0$ is the 1/T1 without the contrast agent (i.e. zero concentration). With this relation the concentration map can be determined from the T1 map. For the time resolved T1 map a time resolved concentration map can be generated. This describes the course of the agent in the body. In a case where a therapeutic agent is mixed with the contrast agent, the therapeutic agent can likewise be tracked.

It is to be understood that, rather than the inversion recovery pulse described above, any type of contrast enhancing preparation pulse sequence can be used. It is also to be understood that, rather than radial trajectories, any type of trajectories can be used in which a center region of k-space would be oversampled.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method of magnetic resonance imaging comprising the steps of:
    applying a preparation sequence to a subject disposed in an examination region;
    acquiring k-space data related to a plurality of k-space trajectories through the center of k-space, the acquiring including:
        acquiring a first subset of k-space data including a first plurality of k-space trajectories, through the center of k-space;
        acquiring a second subset of k-space data including second plurality of trajectories through the center of k-space, the trajectories of the second subset being rotated relative to the trajectories of the first subset;
    reconstructing a first image from the k-space data, including data from at least the first and second subsets, wherein data within a region around the center of k-space of the first subset of the k-space trajectories is not used.

2. A method according to claim 1 wherein the step of reconstructing the first image includes using data within the region around the center of k-space of at least the second subset of the k-space trajectories.

3. A method according to claim 1 wherein the data within the region around the center of k-space of the first subset of trajectories is not acquired during the step of acquiring k-space data.

4. A method according to claim 1 wherein the data within the region around the center of k-space of the first subset of the k-space trajectories is omitted during the step of reconstructing the first image.

5. A method according to claim 1 wherein the acquiring step further includes:
    acquiring a plurality of additional subsets of k-space data including additional k-space trajectories through the center of k-space that are rotated relative to the trajectories of the first and second subsets, and each other.

6. A magnetic resonance scanner including a main magnet, gradient coils, RF coils, and an MR control processor programmed to control the magnetic resonance scanner to perform the method of claim 1.

7. A method of magnetic resonance imaging comprising the steps of:
    applying a preparation pulse sequence to a subject disposed in an examination region;
    acquiring k-space data related to a plurality of k-space trajectories through the center of k-space;
    reconstructing a first image from the k-space data wherein data within a region around the center of k-space of at least a first of the k-space trajectories is not used; and;
    reconstructing a second image from the k-space data wherein data within the region around the center of k-space of a k-space trajectory other than the second k-space trajectory is used.

8. A method according to claim 7 further comprising the steps of:
    generating a map for at least one pixel across the first and second images.

9. A method according to claim 7 wherein the second of the k-space trajectories corresponds temporally to a null point.

10. A magnetic resonance scanner comprising:
    main magnetic field coils which generate a main magnetic field through an imaging region;
    gradient coils and controls which energize the gradient coils to generate magnetic field gradients across the imaging region;
    radio frequency coils and radio frequency transmitters and receivers which generate RF fields in and receive magnetic resonance data from the imaging region;
    a reconstruction processor for reconstructing the magnetic resonance data into images and to induce magnetic resonance data along a plurality of trajectories through the center of k-space; and
    a reconstruction processor which reconstructs images from k-space trajectories in a peripheral region of k-space and a fraction of k-space trajectories around the center of k-space, the fraction being selectable to reduce motion of artifacts.

* * * * *